United States Patent
Boatner et al.

(10) Patent No.: US 10,125,312 B2
(45) Date of Patent: Nov. 13, 2018

(54) DIVALENT-ION-DOPED SINGLE CRYSTAL ALKALI HALIDE SCINTILLATORS

(71) Applicant: UT-Battelle, LLC, Oak Ridge, TN (US)

(72) Inventors: Lynn A. Boatner, Oak Ridge, TN (US); James A. Kolopus, Clinton, TN (US)

(73) Assignee: UT-BATTELLE, LLC, Oak Ridge, TN (US)

( * ) Notice: Subject to any disclaimer, the term of this patent is extended or adjusted under 35 U.S.C. 154(b) by 0 days.

(21) Appl. No.: 15/257,160

(22) Filed: Sep. 6, 2016

(65) Prior Publication Data
US 2018/0066185 A1    Mar. 8, 2018

(51) Int. Cl.
| | |
|---|---|
| C09K 11/77 | (2006.01) |
| C30B 11/08 | (2006.01) |
| C30B 29/12 | (2006.01) |
| C30B 33/02 | (2006.01) |
| G01T 1/202 | (2006.01) |
| G01T 3/06 | (2006.01) |

(52) U.S. Cl.
CPC .......... *C09K 11/7733* (2013.01); *C30B 11/08* (2013.01); *C30B 29/12* (2013.01); *C30B 33/02* (2013.01); *G01T 1/2023* (2013.01); *G01T 3/06* (2013.01)

(58) Field of Classification Search
CPC ..... C09K 11/7733; G01T 1/2023; G01T 3/06; C30B 29/12; C30B 33/02; C30B 11/08
USPC ........................................................ 250/362
See application file for complete search history.

(56) References Cited

U.S. PATENT DOCUMENTS

| | | | |
|---|---|---|---|
| 3,373,279 A | | 3/1968 | Hofstadter et al. |
| 4,050,905 A | * | 9/1977 | Swinehart ............... C30B 11/00 117/79 |
| 7,180,068 B1 | * | 2/2007 | Brecher ............... C09K 11/772 250/361 R |
| 7,759,645 B1 | * | 7/2010 | Brecher .................. G01T 1/202 250/361 R |
| 8,476,598 B1 | * | 7/2013 | Pralle ................. H01L 27/14658 250/370.09 |

(Continued)

FOREIGN PATENT DOCUMENTS

| | | | | |
|---|---|---|---|---|
| EP | 1286365 A2 | * | 2/2003 | ......... C09K 11/7733 |
| EP | 1347460 A1 | * | 9/2003 | ......... C09K 11/7733 |

(Continued)

OTHER PUBLICATIONS

Palilla et al., Fluorescent Properties of Alkaline Earth Aluminates of the Type MAl2O4 Activated by Divalent Europium, Jun. 1968, J. Electrochem. Soc.: Solid State Science, pp. 642-644.*

(Continued)

*Primary Examiner* — David Porta
*Assistant Examiner* — Gisselle Gutierrez
(74) *Attorney, Agent, or Firm* — Scully Scott Murphy & Presser

(57) ABSTRACT

A single crystal composition includes an alkali halide crystal doped with a divalent element in the amount of 0.5 to 5 weight percent, the doped crystal having an optical transmission of at least 45% at at least one wavelength. An alkali halide doped with at least one of europium and ytterbium is particularly useful as a scintillator.

34 Claims, 8 Drawing Sheets

(56) References Cited

U.S. PATENT DOCUMENTS

| | | | |
|---|---|---|---|
| 2005/0087707 A1* | 4/2005 | Leblans | G21K 4/00 250/584 |
| 2005/0089142 A1* | 4/2005 | Marek | C09K 11/616 378/98.8 |
| 2010/0044576 A1 | 2/2010 | Payne et al. | |
| 2011/0165422 A1 | 7/2011 | Gundiah et al. | |
| 2012/0273726 A1 | 11/2012 | Zhuravleva et al. | |
| 2012/0286165 A1* | 11/2012 | Gautier | G01T 1/202 250/361 R |
| 2013/0320217 A1* | 12/2013 | Kawaguchi | G01T 3/06 250/361 R |
| 2014/0145085 A1 | 5/2014 | Wu | |
| 2014/0363674 A1 | 12/2014 | Zhuravleva et al. | |
| 2015/0219770 A1 | 8/2015 | Cherepy et al. | |
| 2015/0301195 A1 | 10/2015 | Antonuk | |
| 2015/0301197 A1 | 10/2015 | Wei et al. | |
| 2016/0168458 A1 | 6/2016 | Stand et al. | |
| 2016/0280992 A1* | 9/2016 | Kawai | C09K 11/00 |

FOREIGN PATENT DOCUMENTS

| | | | | |
|---|---|---|---|---|
| EP | 1349177 A2 * | 10/2003 | | C09K 11/025 |
| EP | 1376614 A2 * | 1/2004 | | G21K 4/00 |
| EP | 1443525 A2 * | 8/2004 | | C09K 11/7733 |
| UA | 77423 C2 | 8/2005 | | |

OTHER PUBLICATIONS

Lapshin et al., Activation of Alkali Halides with Europium Converted to the Divalent State by and Explosion, 1968, Zhurnal Prikladnoi Spectrospkopii, vol. 8, Np. 6, pp. 1033-1038.*

Suzuki, Kazuo, On Precipitation of Metastable Centres in Solid Solutions NaCl-CaCl2, Acta Cryst., 1954, pp. 514-515, vol. 7.

Lopez, F.J., Optical Absorption and Luminescence Investigations of the Precipitated Phases of Eu2+ IN NaCl and KCl Single Crystals, Physical Review B, Dec. 12, 1980, pp. 6428-6439, vol. 22, No. 12.

Miyake, S. et al., X-ray Studies on the Structures of Solid Solutions NaCl-CaCl2, I. Main Results and General Considerations, Journal of the Physcial Society of Japan, Sep.-Oct. 1954, pp. 702-712, vol. 9, No. 5.

Suzuki, K., X-ray Studies on the Structures of Solid Solutions NaCl-CaCl2, II. Structures of {111} and {310} Plate-Zones, Journal of the Physical Society of Japan, Sep. 1955, pp. 794-804, vol. 10, No. 9.

Suzuki, K., X-ray Studies on the Structures of Solid Solutions NaCl-CaCl2, III. Influence of Heat Treatments on the Diffuse Reflexions of X-rays due to {111} and {310} Plate-Zones, Journal of the Physical Society of Japan, Feb. 1958, pp. 179-188, vol. 13, No. 2.

Suzuki, K., X-ray Studies on Precipitation of Metastable Centers in Mixed Crystals NaCl-CdCl2, Journal of the Physical Society of Japan, Jan. 1961, pp. 67-78, vol. 16, No. 1.

Schenck, J., "Activation of Ltihium Iodide by Europium", Nature, (Mar. 21, 1953), vol. 171, No. 4351, 2 pages.

Nicholson, K.P. et al., "Some lithium iodide phosphors for slow neutron detection", British Journal of Applied Physics, (1955), vol. 6, pp. 104-106.

International Search Report and Written Opinion dated Oct. 23, 2017 issued in PCT/US17/50195.

* cited by examiner

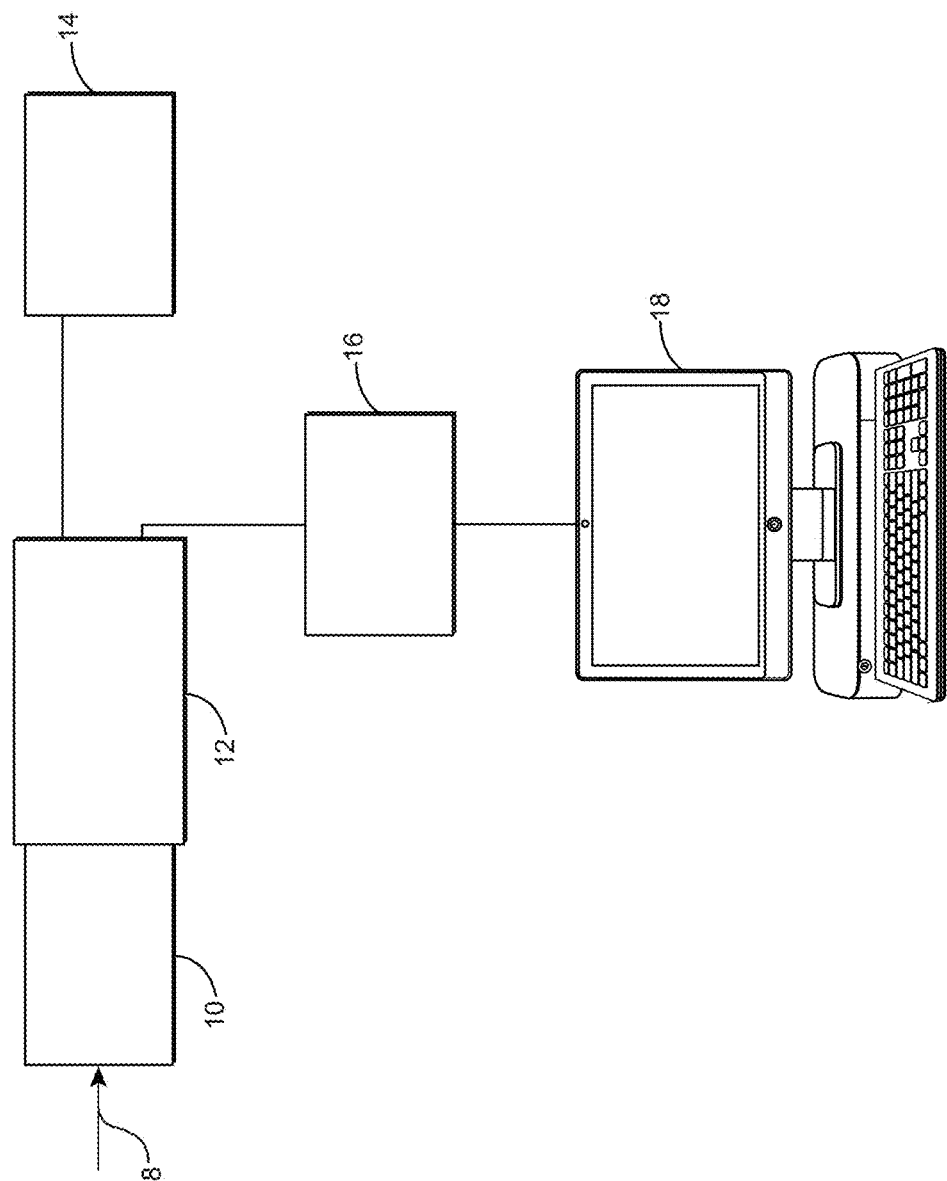

DIVALENT-ION-DOPED SINGLE CRYSTAL ALKALI HALIDE SCINTILLATORS

STATEMENT REGARDING FEDERALLY SPONSORED RESEARCH

The United States Government has rights in this invention pursuant to contract no. DE-AC05-00OR22725 between the United States Department of Energy and UT-Battelle, LLC.

BACKGROUND OF THE INVENTION

Although alkali halide crystals such as lithium iodide (LiI), sodium iodide (NaI), and cesium iodide (CsI), for example, can be activated with divalent rare-earth ions such as $Eu^{(2+)}$, such activated crystals have heretofore not been widely used as scintillators for radiation detection applications due to their incompatibility with the incorporation of divalent activator ions at relatively high levels—nominally between 0.5 and 5.0 weight percent (hereinafter expressed simply as %)—referred to herein as "heavily doped". This is due to the fact that when divalent ions such as $Eu^{2+}$ are added to the growing single crystals of monovalent-cation alkali halides at a level of between ~0.5 and 5.0%, the resulting single crystals are effectively white and opaque due to the formation of so-called Suzuki Phase precipitates. These Suzuki-phase precipitates scatter the scintillator light thereby adversely affecting the light transmission and reducing the overall radiation detection performance (e.g. light yield and energy resolution) of the scintillator crystals—for either gamma-ray detection (or in the case of $LiI:Eu^{2+}$ crystals containing preferably isotopically enriched $^6Li$ as the neutron converter) for thermal neutron detection. Moreover, Suzuki-phase precipitates preclude the use of other divalent-doped alkali halide crystals for sundry optical applications.

BRIEF SUMMARY OF THE INVENTION

In accordance with one aspect of the present invention, the foregoing and other objects are achieved by a single crystal composition that includes an alkali halide crystal doped with a divalent element in the amount of 0.5 to 5 weight percent, the doped crystal having an optical transmission of at least 45% at at least one wavelength.

In accordance with another aspect of the present invention, a scintillator includes an alkali halide crystal doped with a divalent element in the amount of 0.5 to 5 weight percent, the doped crystal having an optical transmission of at least 45% at a wavelength of about 500 nm, wherein the doped crystal scintillates when excited by radiation.

In accordance with an further aspect of the present invention, a radiation detector includes an alkali halide crystal doped with a divalent element in the amount of 0.5 to 5 weight percent, the doped crystal having an optical transmission of at least 45% at a wavelength of about 500 nm, wherein the doped crystal scintillates when excited by radiation, and a photodetector for detecting the scintillation.

In accordance with another aspect of the present invention, a method of making a single crystal composition includes the steps of: growing a crystal comprising an alkali halide crystal doped with a divalent element in the amount of 0.5 to 5 weight percent, the crystal comprising Suzuki Phase precipitates and having an as-grown optical transmission of less than 40% at at least one wavelength; heating the crystal in a dry, inert atmosphere to a temperature and for a time period sufficient to dissolve the Suzuki Phase precipitates; and cooling the heated crystal at a cooling rate that is sufficiently rapid to minimize the re-formation of Suzuki Phase precipitates, the cooled crystal having an optical transmission of at least 45% at the at least one wavelength.

In accordance with a further aspect of the present invention, a method of detecting radiation includes the steps of: providing a scintillator comprising an alkali halide crystal doped with a divalent element in the amount of 0.5 to 5 weight percent, the doped crystal having an optical transmission of at least 45% at a wavelength of about 500 nm; disposing the scintillator in the path of a beam of radiation so that the scintillator scintillates upon absorbing said radiation; and detecting the scintillation.

BRIEF DESCRIPTION OF THE DRAWINGS

FIG. 9 is a schematic diagram of a radiation detector.

Figure 2:
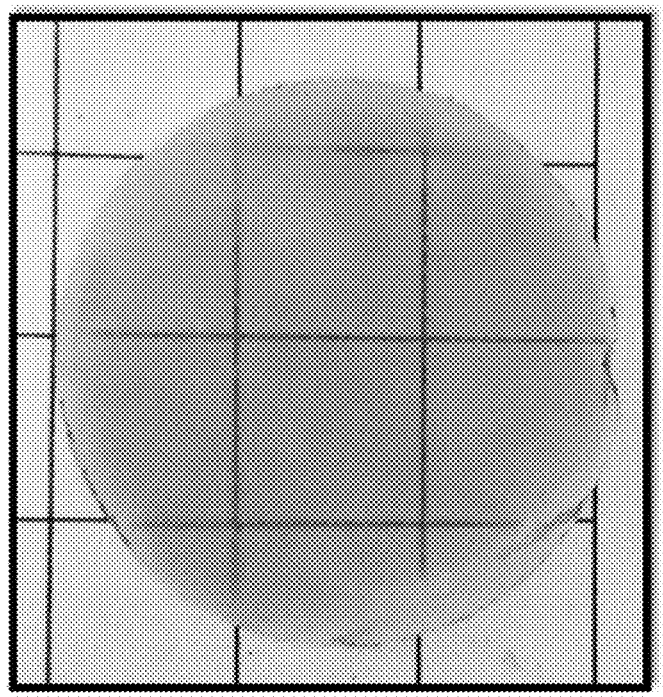
FIG. 2 is a photograph of a specimen of a heat-treated and rapidly cooled, 20 mm diameter, 5 mm thick, single crystal of LiI doped with 3 wt % $EuI_2$.

For a better understanding of the present invention, together with other and further objects, advantages and capabilities thereof, reference is made to the following disclosure and appended claims in connection with the above-described drawings.

DETAILED DESCRIPTION OF THE INVENTION

Described herein is a method of crystal growth and post growth treatment of heavily divalent-element-doped alkali halide single crystals for which the Suzuki Phase precipitates are eliminated, thereby rendering the otherwise effectively opaque crystals highly transparent, especially to radiation-induced scintillation light resulting from gamma ray or neutron excitation. The described method combines high concentration divalent ion doping during crystal growth with a post growth thermal treatment.

The method described herein is not restricted to the formation of scintillator materials or radiation detection applications; it is applicable to optical materials in general, including lasers, infrared detectors, ultraviolet detectors, phosphors for solid state lighting and/or fluorescent lighting applications, optical amplifiers, optical filters, or any other optical applications requiring heavy divalent-ion doping of alkali halides.

Many applications of the new compositions described herein follow the recent development of improved thermal neutron gamma-ray detectors, alpha particle detectors, beta particle detectors, heavy particle radiation detectors, and optical instruments.

The method described herein can be applied to alkali halides such as, for example, lithium fluoride (LiF), lithium chloride (LiCl), lithium bromide (LiBr), lithium iodide (LiI), sodium fluoride (NaF), sodium chloride (NaCl), sodium bromide (NaBr), sodium iodide (NaI), potassium fluoride (KF), potassium chloride (KCl), potassium bromide (KBr), potassium iodide (KI), rubidium fluoride (RbF), rubidium chloride (RbCl), rubidium bromide (RbBr), rubidium iodide (RbI), cesium fluoride (CsF), cesium chloride (CsCl), cesium bromide (CsBr), and cesium iodide (CsI). Moreover, the method described herein can be applied to mixtures of alkali halides, including eutectic mixtures thereof.

The method described herein is further applicable to any divalent dopant element or any combination of divalent dopant elements at any concentration that results in the formation of Suzuki phase precipitates. Applicable rare-earth (RE) dopants can include at least one element of the following group: europium (Eu), holmium (Ho), lanthanum (La), samarium (Sm), scandium (Sc), thulium (Tm), ytterbium (Yb), and yttrium (Y). Applicable iron group dopants can include at least one element of the following group: vanadium (V), chromium (Cr), manganese (Mn), iron (Fe), cobalt (Co), nickel (Ni), copper (Cu), and zinc (Zn). Dopant elements that are generally considered to be most suitable for scintillators include europium and ytterbium.

Moreover, elements described herein can be isotopically enriched. One important example is enriched lithium-6 ($^6$Li) for use as a neutron converter for neutron detection applications.

An alkali halide host single crystal can be doped with a divalent dopant element in an amount in the range of 0.5 to 5 weight percent, 0.7 to 5 weight percent, 0.8 to 5 weight percent, 0.9 to 4.5 weight percent, 1 to 4 weight percent, and any other specific range therewithin. The amount of Suzuki Phase precipitates varies directly with the amount of divalent dopant element. Optical transmission of the crystal varies indirectly with the amount of Suzuki Phase precipitates. Hence, a host crystal having 5 weight percent of a divalent dopant element will have a greater amount of Suzuki Phase precipitates and a lower optical transmission than a host crystal of the same composition having 0.5 weight percent of the same divalent dopant element. Dopant amounts of less than 0.5 weight percent are not expected to contain a significant concentration of Suzuki Phase precipitates; dopant amounts of greater than 5 weight percent are not generally practical because of the formation of non-Suzuki second phases.

The doped crystal can be initially grown by any well-known, conventional method that is known to those skilled in the art of single crystal growth. Examples include, but are not limited to Bridgman methods, Czochralski methods, Kyropoulos methods, float-zone growth methods, heat-exchanger methods, solution growth methods, and high-temperature solution growth methods, and any other conventional melt-crystal-growth methods. The two main objectives are to produce an alkali halide single crystal that (1) is of an appropriate size for a desired application and (2) is essentially free of defects, or at least is sufficiently free of defects that any defects that are present do not interfere with the intended functionality of the crystal to an undesirably significant extent. Suzuki Phase precipitates are present in the as-grown crystal. Suzuki Phase precipitates are responsible for the scattering of light that reduces the optical transparency of the crystal to less than 40% at at least one wavelength, usually less than 30% at at least one wavelength.

In a first heat-treatment step, the divalent-element-doped alkali halide single crystal that contains Suzuki Phase precipitates is heated in a dry inert atmosphere such as that provided by dry high-purity argon or other dry noble gas, by another chemically inert (with respect to reactions with alkali halides) atmosphere) gas, or by a heating in a reactive gas such as forming gas (i.e., Ar plus 4% hydrogen). The purpose of heating in a gas such as forming gas is to adjust the valence state of a given dopant to a desired value and eliminating or reducing unwanted valence states in activator ion dopants.

Subsequent to the single crystal growth, the single crystal containing the Suzuki Phase precipitates is heated to a temperature and for a time period at which point most or all of the Suzuki Phase precipitates dissolve, and the associated components are dispersed by diffusion into the alkali halide single-crystal host matrix, thus clarifying the crystal. The significantly increased transparency of the materials can be monitored visually or by optical transmission methods until increased optical clarity is achieved. The temperature, and possibly the duration of the first step are limited by the onset of melting and/or disintegration of the crystal. Moreover, once the material is heated to a temperature and for a time required to remove the precipitates and thereby clarify the crystal, further heating of the crystal has no additional beneficial effects. The skilled artisan can easily determine the appropriate temperature and the duration of the first step with a reasonable amount of experimentation. The skilled artisan will further recognize that the temperature and the duration of the first step are dependent primarily upon the composition of the crystal, and to a lesser extent by the dimensions of the crystal.

In a second heat-treatment step, the crystal is cooled (quenched) at a cooling rate that is sufficiently rapid to prevent, or at least significantly minimize, re-formation of the Suzuki phase precipitates. If the cooling rate is not sufficiently rapid, Suzuki Phase precipitates will form again and the crystal will revert to the as-grown state. The cooling step can be achieved, for example, by subjecting the hot crystal to a stream of cool, flowing helium (or other inert) gas, by placing the crystal in thermal contact with a cold copper (or other metal) block, by immersing the crystal in a liquid bath (for example, mineral oil nominally at room temperature). The skilled artisan will recognize that any of sundry well-known rapid cooling methods can be used to carry out the second heat-treatment step.

The cooling rate used to prevent, or at least minimize, re-formation of Suzuki Phase precipitates must be controlled so that it is sufficiently rapid to achieve the desired level of transparency in the crystal, but not so rapid such that it induces mechanical fracturing of the crystal due to thermal stresses associated with the rapid cooling process. The skilled artisan can easily determine the most efficient cooling rate with a reasonable amount of experimentation. Cooling rate will vary depending on the physical size of the crystal to be cooled, on the specific alkali halide, and on the specific divalent element dopant(s) used.

The cooling rates used for the quenching of alkali-halide scintillator materials during the process employed for the removal of Suzuki phase precipitates of the divalent activator in these materials vary with the specific material composition, geometry, and thermal characteristics of the scintillator material. The objective of the quenching step is to obtain a crystal that has an optical transmission of at least 45%, preferably at least 50%, at at least one wavelength in the optical spectrum. The skilled artisan will recognize that the wavelength(s) of optical transparency will depend upon the specific composition of the crystal. For example, a heat-treated, quenched single crystal of lithium iodide (LiI) doped with 3 wt % europium iodide ($EuI_2$) has optical transparency at a wavelength of about 500 nm. The skilled artisan will further recognize that there a small but noteworthy variation in wavelength measurement exists among the sundry well-known, conventional wavelength measurement instruments and techniques.

As a general rule, the initial rate of cooling for these materials can be between 100° C. and 125° C. per minute, which can be gradually decreased as the crystal temperature approaches room temperature (i.e., the cooling rate may not be constant, being more rapid at a higher initial temperature). Crystals in which the dissolution of the Suzuki phase precipitates benefits from a higher holding temperature to remove the precipitates may also benefit from a higher initial cooling rate than those crystals wherein the dissolution occurs at lower temperatures. In the case of europium-activated sodium iodide, the initial cooling rate may be as high as 190° C. per minute in the first minute of quenching, but it quickly approaches the rate of 40° C. to 50° C. per minute that is usually observed after 3 to 4 minutes of cooling. In most the cases, the quenching process is generally complete within 5 minutes of the initial quenching and after the sample has reached a temperature below approximately 150° C.

Typically, a detector sample for gamma ray detection can have dimensions in which the thickness of the scintillator crystal is approximately equal to its diameter, which can be in the range of 25 to 30 mm. However, in the case of scintillator materials used for neutron detection, such as LiI:Eu, the detector thickness may be reduced to as little as 1.5 to 5 mm when isotopically enriched 95% $^6$Li is utilized—with no appreciable loss of the neutron detector performance. This characteristic offers an economic advantage in that a greater number of detector crystals may be produced from the bulk crystal boule. It must be taken into account that the thinner geometry of the scintillator crystal has a potential to increase the likelihood of cracking due to thermal stresses induced by a cooling rate that is too rapid during the quenching process. These stresses may be mitigated by quenching at a lower initial cooling rate of 80° C. to 100° C. per minute with essentially no observable degradation of the crystal transparency.

EXAMPLE I

Figure 1:
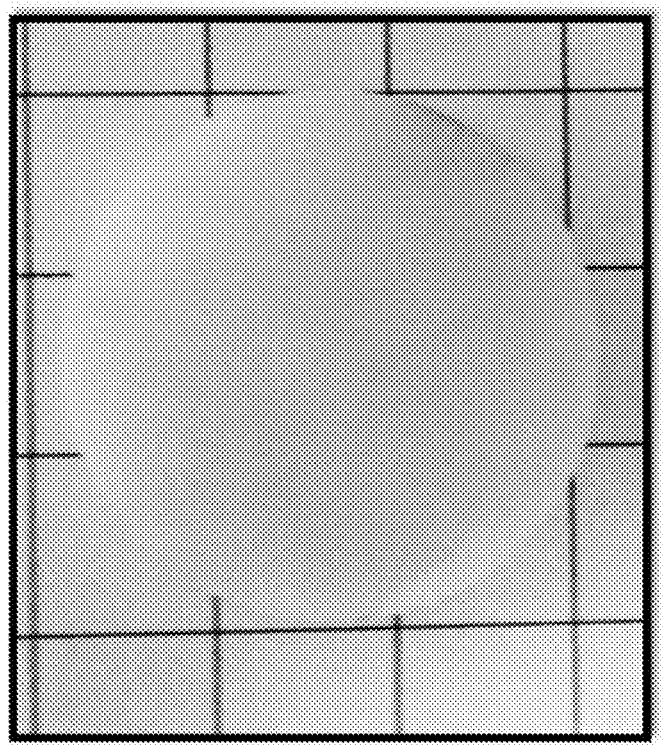
FIG. 1 is a photograph of a specimen of an as-grown, 20 mm diameter, 5 mm thick, single crystal of LiI doped with 3 wt % $EuI_2$.

A 20 mm diameter, 5 mm thick, single crystal of LiI doped with 3 wt % $EuI_2$ was grown as described hereinabove, according to the well-known, conventional Bridgman method. As shown in FIG. 1, the as-grown crystal was white in color, cloudy in appearance, and essentially opaque due to the presence of Suzuki Phase precipitates. In a two-step heat treatment as described hereinabove, the crystal was first heated under an argon atmosphere to a temperature of 400° C. and held for 16 hours at that temperature. The crystal was subsequently quenched in flowing He gas with an initial cooling rate of ~100° C./min to complete the heat treatment. This cooling rate did not induce any thermally induced fracturing of the single crystal. As shown in FIG. 2, the heat-treated crystal was pale yellow in color, essentially clear, and essentially transparent.

Figure 3:
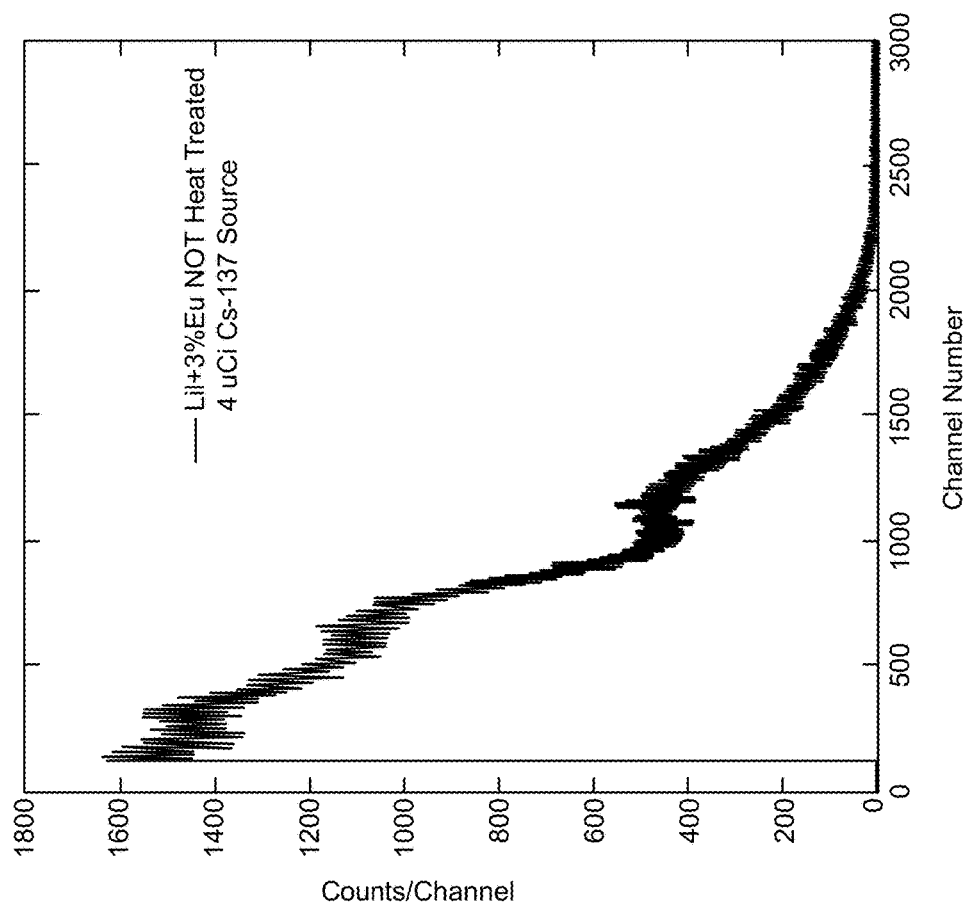
FIG. 3 is a graph showing a gamma-ray-excited pulse height spectrum (662 keV excitation from 4 microcuries of cesium-137) of an as-grown crystal described in Example I.
Figure 4:
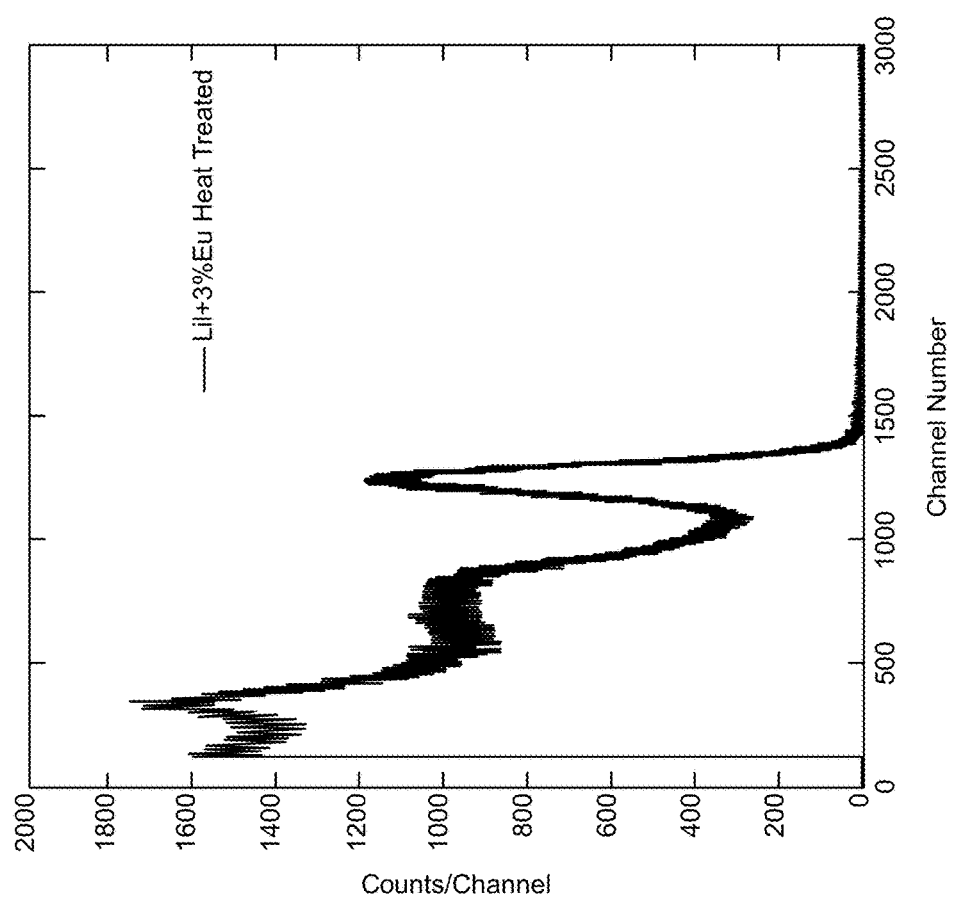
FIG. 4 is a graph showing a gamma-ray-excited pulse height spectrum (662 keV excitation from 4 microcuries of cesium-137) of a heat-treated crystal described in Example I.

A crystal made in accordance with Example I was tested in the as-grown state and in the heat-treated and quenched state. FIG. 3 shows the pulse-height spectrum of the as-grown crystal. The spectrum is characterized by a weak and broad photopeak. FIG. 4 shows the pulse-height spectrum of the quenched crystal. The spectrum is characterized by a strong, well-defined, distinct photopeak that is well-separated from the portion of the spectrum known as the Compton edge. A comparison of FIGS. 3 and 4 clearly demonstrates the improved scintillator properties that result from the removal of the Suzuki Phase precipitates as described herein.

Figure 5:
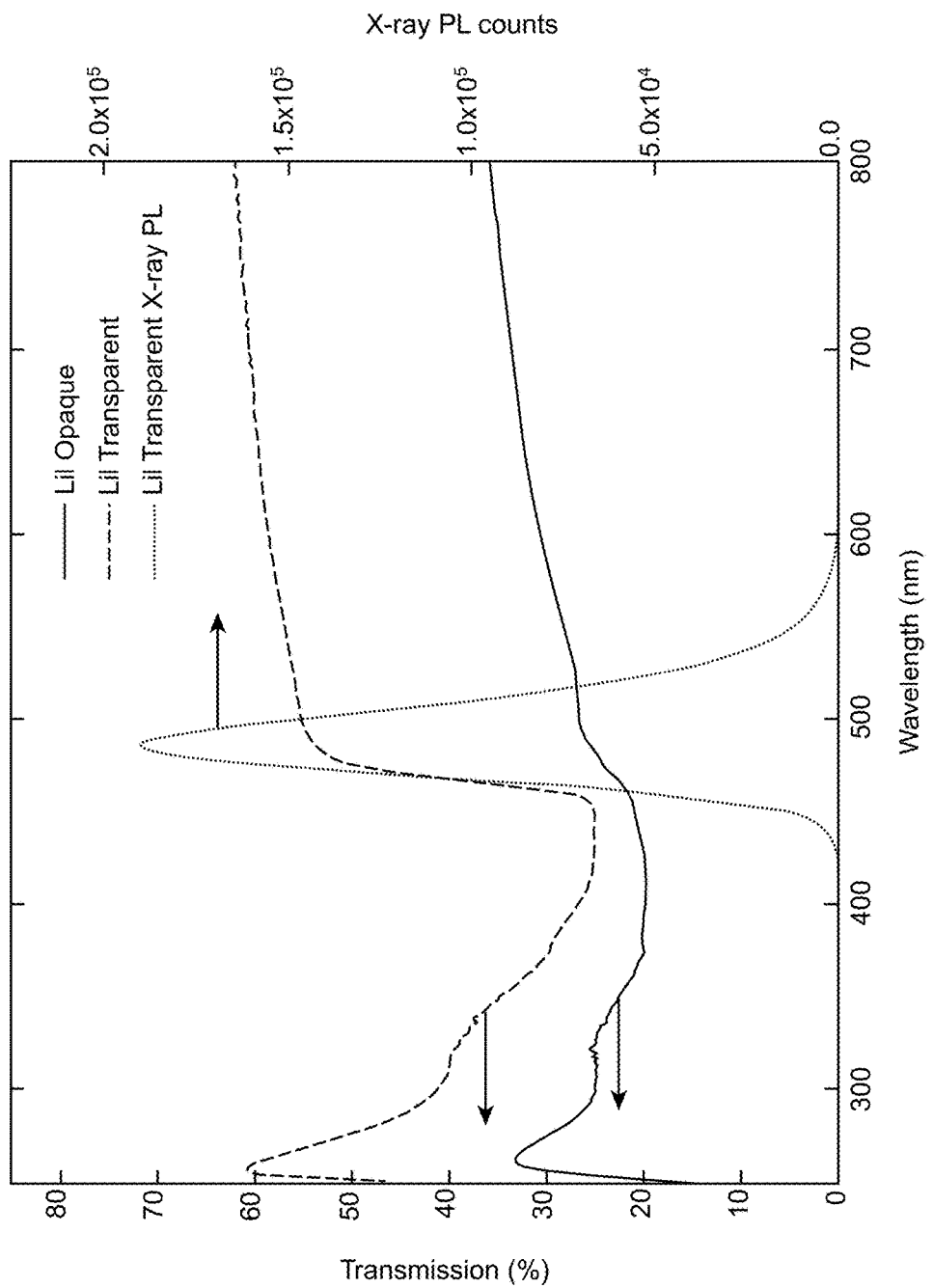
FIG. 5 is a graph showing optical transmission of as-grown and heat-treated and rapidly cooled crystals described in Example I, and an overlaid luminescence spectrum (150 KV X-ray-excitation) of a heat-treated crystal described in Example I.

FIG. 5 illustrates two desirable characteristics of the heat-treated crystal. Firstly, attention is drawn to the percentage of optical transmission before and after heat treatment of a crystal. The Y-axis scale on the left side of FIG. 5 is for the two curves having the two left-pointing pointing arrows. The Y-axis scale on the right side applies to the curve with the right-pointing arrow. Optical transmission of the crystal after the heat treatment is over twice that of the as-grown crystal. Secondly, comparison of the luminescence spectrum for the heat-treated crystal with the optical transmission curve shows a beneficially high degree of overlap between the luminescence emission and the optical transmission of the thermally treated crystal; the peak of the luminescence curve advantageously coincides with a region of high optical transmission of the crystal.

Figure 6:
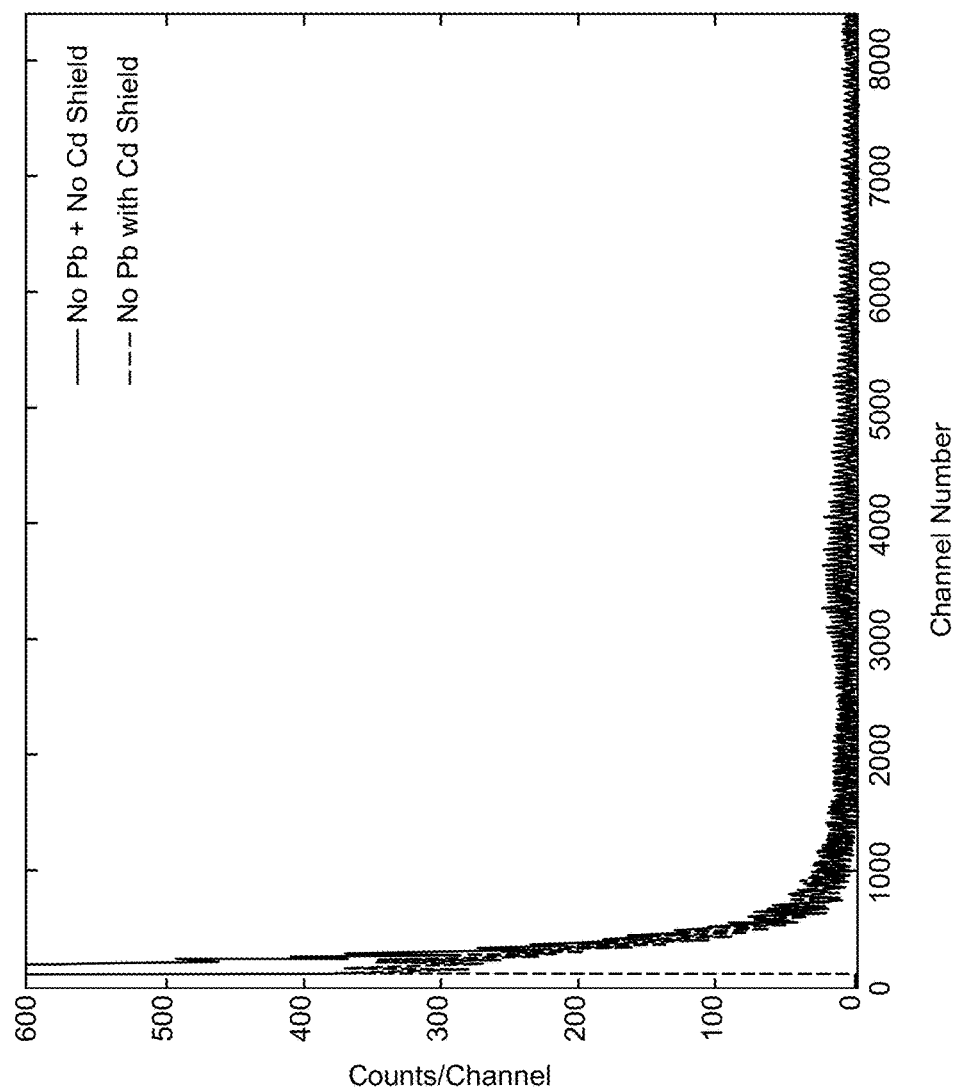
FIG. 6 is a graph showing pulse height spectra of an as-grown crystal described in Example I, both with and without a Cd shield between the crystal and the thermal neutron source.
Figure 7:
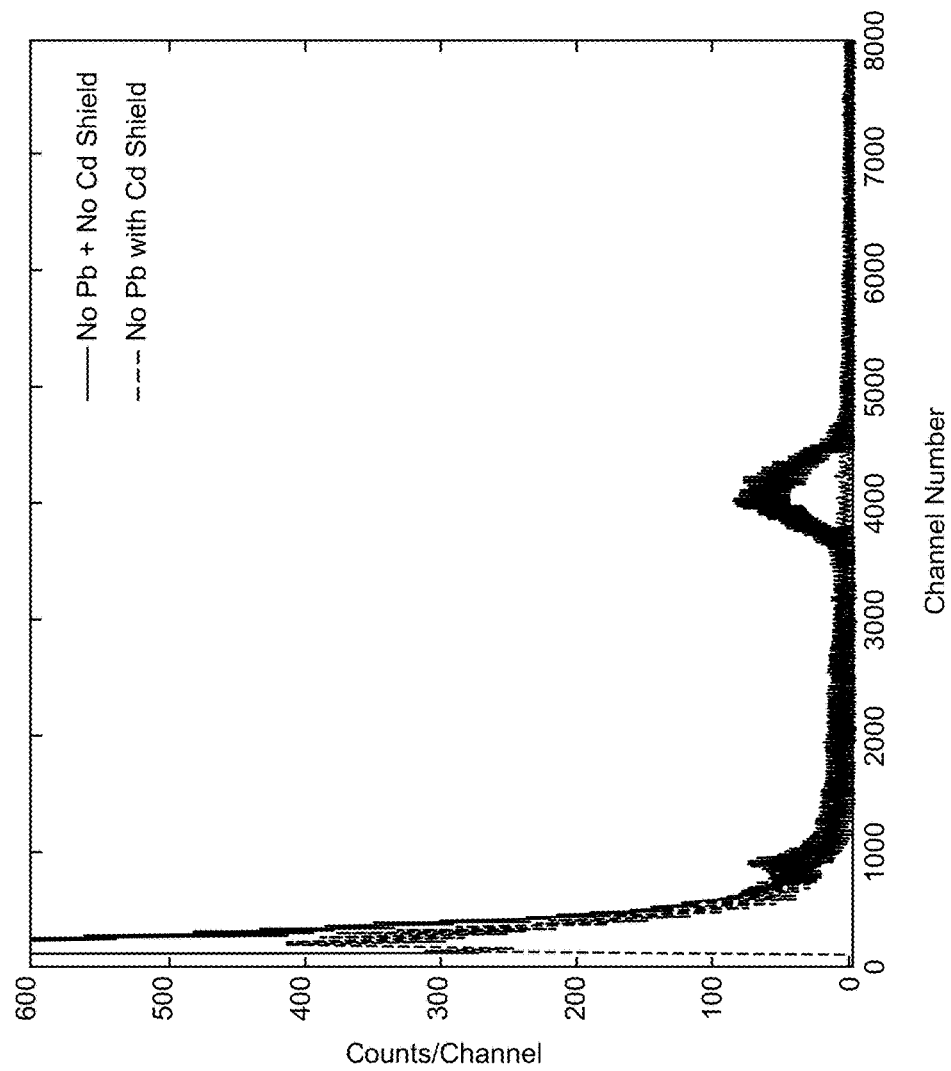
FIG. 7 is a graph showing pulse height spectra of a heat-treated crystal described in Example I, both with and without a Cd shield between the crystal and the thermal neutron source.

A crystal made in accordance with Example I was tested for the capability to detect thermal neutrons in the as-grown state and in the heat-treated and quenched state. FIG. 6 shows the pulse height spectra obtained using an AmLi neutron source for the cases of an as-grown crystal, and FIG. 7 shows the pulse height spectra obtained using the same AmLi neutron source for the cases of a heat-treated and quenched crystal. Both spectra are shown with a cadmium shield in place and with the shield removed. Both shielded and unshielded spectra for the as-grown crystal spectra are weak—with only a few counts in the region of 3000 to 6000 channels. For the case of the heat-treated crystal, the spectrum with the Cd shield removed shows a distinct strong photopeak near channel number 4,000 plus a weaker peak at s lower channel number just below channel 1,000. The features are not present when the neutron flux is arrested by the insertion of the Cd shield that blocks the neutrons. Thus, FIGS. 6 and 7 conclusively show that the response of the heat-treated crystal is attributable to the detection of neutrons.

The presence of the distinct photopeak at approximately 4,000 channel numbers in FIG. 7 is due to neutron detection in the heat treated and quenched crystal. The peak is separated by, for example, 2,000 to 3,000 lower channel numbers from a photopeak due to the detection of 662 keV gamma rays from a 137Cs source. The large separation in channel numbers establishes the potential for the discrimination of neutron signals from gamma ray signals by using pulse height discrimination rather than pulse shape discrimination.

EXAMPLE II

A 20 mm diameter, 5 mm thick, single crystal of LiI doped with 5 wt % $EuI_2$ was made in accordance with Example 1.

Figure 8:
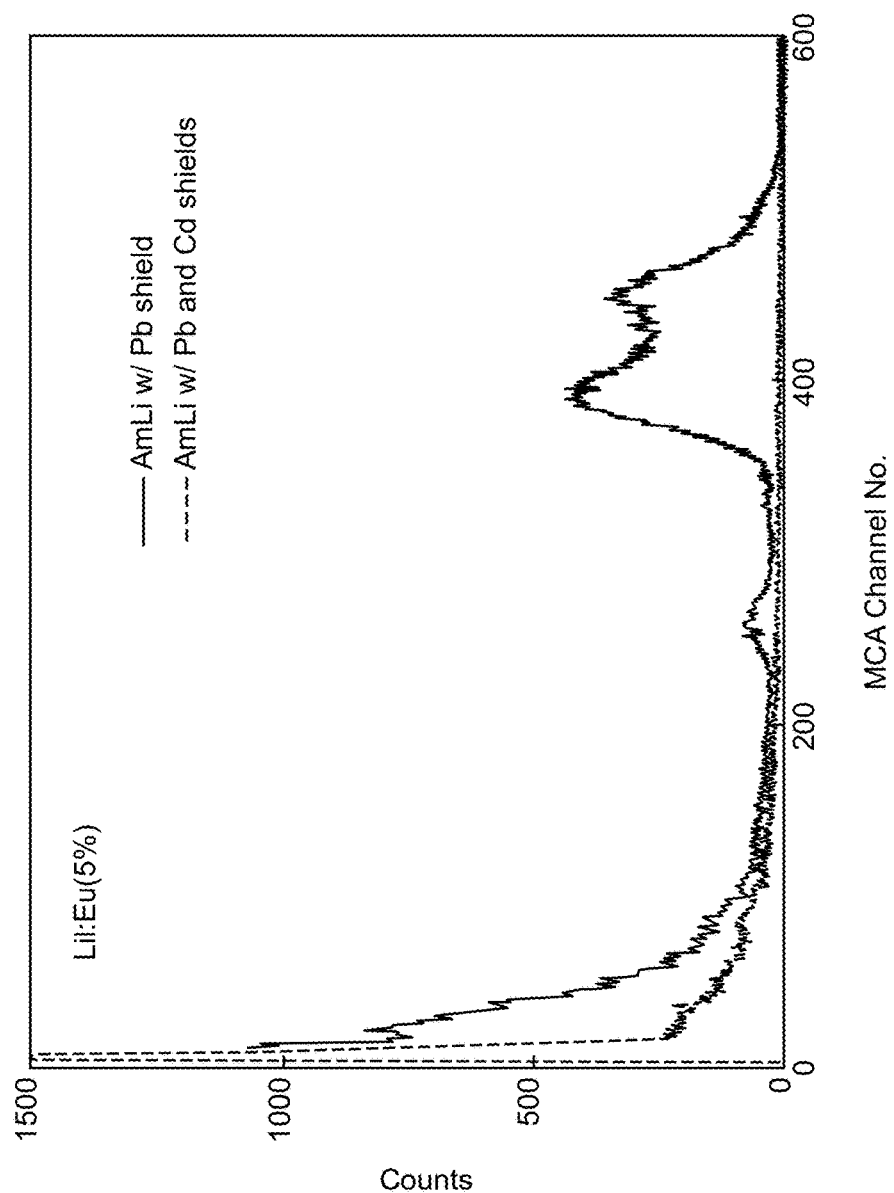
FIG. 8 is a graph showing pulse height spectra of a heat-treated crystal described in Example II, both with and without a Cd shield between the crystal and the thermal neutron source.

The heat-treated crystal was tested for thermal neutron detection. FIG. 8 shows two pulse height spectra taken using activation by thermal neutrons from an AmLi neutron source. A first spectrum was obtained with two shields in place. The first shield was a 5.0 cm-thick lead gamma ray shield between the neutron source and the scintillator crystal for the purpose of blocking gamma rays, thus eliminating any response of the scintillator crystal to gamma radiation. The second shield was a 3.5 mm-thick cadmium shield placed between the AmLi thermal neutron source and the scintillator crystal, thus eliminating any response of the scintillator crystal to thermal neutrons. The first spectrum shows no response.

A second spectrum was taken with only the lead gamma ray shield in place; the cadmium shield was removed, allowing a response of the scintillator crystal to thermal neutrons. The second spectrum shows a remarkable response to thermal neutrons. The double photopeak is attributed to the effect of the very high 5% EuI doping level that, in this example, actually alters the crystal field interactions with the Eu activator ions. This assignment is supported by the fact that the double photopeak structure is also present in the case of pulse height spectra of 662 keV gamma ray excitation. This type of double photopeak structure is not observed in the case of LiI crystals doped with 3% EuI.

A radiation detector can include a scintillator as described hereinabove. Referring to FIG. 9, a scintillator 10 is disposed in optical communication with a photomultiplier 12, which is powered by a high voltage power source 14. An electronics package 16 can include components such as high a voltage divider, a pulse amplifier, a pulse discriminator, a digital counter, and a coincidence circuit. A computer system 18 can facilitate data input, data interpretation, data storage, data integration, and data display.

Referring again to FIG. 9, incident radiation 8 enters the scintillator 10, causing the scintillator 10 to scintillate, producing a flash of light which is detected by the photomultiplier 12, which causes a signal to be sent to the electronics package 16, which inputs data to the computer system 18, which processes and displays the data.

While there has been shown and described what are at present considered to be examples of the invention, it will be obvious to those skilled in the art that various changes and modifications can be prepared therein without departing from the scope of the inventions defined by the appended claims.

What is claimed is:

1. A single crystal composition comprising an alkali halide crystal doped with a divalent element in the amount of 0.5 to 5 weight percent, said doped crystal having an optical transmission of at least 45% at at least one wavelength.

2. A single crystal composition in accordance with claim 1 wherein said optical transmission is at least 50%.

3. A single crystal composition in accordance with claim 1 wherein said alkali halide crystal comprises at least one alkali halide selected from the group consisting of lithium fluoride, lithium chloride, lithium bromide, lithium iodide, sodium fluoride, sodium chloride, sodium bromide, sodium iodide, potassium fluoride, potassium chloride, potassium bromide, potassium iodide, rubidium fluoride, rubidium chloride, rubidium bromide, rubidium iodide, cesium fluoride, cesium chloride, cesium bromide, and cesium iodide.

4. A single crystal composition in accordance with claim 1 wherein said divalent element comprises at least one divalent element selected from the group consisting of europium, holmium, lanthanum, samarium, scandium, thulium, ytterbium, yttrium, vanadium, chromium, manganese, iron, cobalt, nickel, copper, and zinc.

5. A scintillator comprising an alkali halide crystal doped with a divalent element in the amount of 0.5 to 5 weight percent, said doped crystal having an optical transmission of at least 45% at a wavelength of about 500 nm, wherein said doped crystal scintillates when excited by radiation.

6. A scintillator in accordance with claim 5 wherein said optical transmission is at least 50%.

7. A scintillator in accordance with claim 5 wherein said alkali halide crystal comprises at least one alkali halide selected from the group consisting of lithium fluoride, lithium chloride, lithium bromide, lithium iodide, sodium fluoride, sodium chloride, sodium bromide, sodium iodide, potassium fluoride, potassium chloride, potassium bromide, potassium iodide, rubidium fluoride, rubidium chloride, rubidium bromide, rubidium iodide, cesium fluoride, cesium chloride, cesium bromide, and cesium iodide.

8. A scintillator in accordance with claim 5 wherein said divalent element comprises at least one divalent element selected from the group consisting of europium and ytterbium.

9. A scintillator in accordance with claim 5 wherein said doped crystal comprises lithium iodide doped with europium.

10. A scintillator in accordance with claim 9 wherein lithium iodide comprises an enriched lithium-6 isotope.

11. A scintillator in accordance with claim 5 wherein said radiation comprises at least one radiation selected from the group consisting of alpha radiation, beta radiation, gamma radiation, neutron radiation, and X-ray radiation.

12. A radiation detector comprising a single crystal composition comprising an alkali halide crystal doped with a divalent element in the amount of 0.5 to 5 weight percent, said doped crystal having an optical transmission of at least 45% at a wavelength of about 500 nm, wherein said doped crystal scintillates when excited by radiation, and a photodetector for detecting the scintillation.

13. A radiation detector in accordance with claim 12 wherein said optical transmission is at least 50%.

14. A radiation detector in accordance with claim 12 wherein said alkali halide crystal comprises at least one alkali halide selected from the group consisting of lithium fluoride, lithium chloride, lithium bromide, lithium iodide, sodium fluoride, sodium chloride, sodium bromide, sodium iodide, potassium fluoride, potassium chloride, potassium bromide, potassium iodide, rubidium fluoride, rubidium chloride, rubidium bromide, rubidium iodide, cesium fluoride, cesium chloride, cesium bromide, and cesium iodide.

15. A radiation detector in accordance with claim 12 wherein said divalent element comprises at least one divalent element selected from the group consisting of europium and ytterbium.

16. A radiation detector in accordance with claim 12 wherein said doped crystal comprises lithium iodide doped with europium.

17. A radiation detector in accordance with claim 16 wherein lithium iodide comprises an isotopically enriched lithium-6 isotope.

18. A radiation detector in accordance with claim 12 wherein said radiation comprises at least one radiation selected from the group consisting of alpha radiation, beta radiation, gamma radiation, neutron radiation, and X-ray radiation.

19. A method of making a single crystal composition comprising the steps of:

a. growing a crystal comprising an alkali halide crystal doped with a divalent element in the amount of 0.5 to 5 weight percent, said crystal comprising Suzuki Phase precipitates and having an as-grown optical transmission of less than 40% at at least one wavelength;

b. heating said crystal in a dry, inert atmosphere to a temperature and for a time period sufficient to dissolve said Suzuki Phase precipitates; and c. cooling said heated crystal at a cooling rate that is sufficiently rapid to minimize the re-formation of Suzuki Phase precipitates, said cooled crystal having an optical transmission of at least 45% at said at least one wavelength.

20. A method of making a single crystal composition in accordance with claim 19 wherein said as-grown optical transmission is less than 30%.

21. A method of making a single crystal composition in accordance with claim 19 wherein said cooled crystal has an optical transmission of at least 50% at said at least one wavelength.

22. A method of making a single crystal composition in accordance with claim 19 wherein said alkali halide crystal comprises at least one alkali halide selected from the group consisting of lithium fluoride, lithium chloride, lithium bromide, lithium iodide, sodium fluoride, sodium chloride, sodium bromide, sodium iodide, potassium fluoride, potassium chloride, potassium bromide, potassium iodide, rubidium fluoride, rubidium chloride, rubidium bromide, rubidium iodide, cesium fluoride, cesium chloride, cesium bromide, and cesium iodide.

23. A method of making a single crystal composition in accordance with claim 19 wherein said divalent element comprises at least one divalent element selected from the group consisting of europium, holmium, lanthanum, samarium, scandium, thulium, ytterbium, yttrium, vanadium, chromium, manganese, iron, cobalt, nickel, copper, and zinc.

24. A method of making a single crystal composition in accordance with claim 19 wherein said doped crystal comprises lithium iodide doped with europium.

25. A method of making a single crystal composition in accordance with claim 24 wherein lithium iodide comprises an isotopically enriched lithium-6 isotope.

26. A method of making a single crystal composition in accordance with claim 19 wherein said cooled crystal scintillates when excited by radiation.

27. A method of making a single crystal composition in accordance with claim 26 wherein said radiation comprises at least one radiation selected from the group consisting of alpha radiation, beta radiation, gamma radiation, neutron radiation, and X-ray radiation.

28. A method of detecting radiation comprising the steps of: a. providing a scintillator comprising a single crystal composition comprising an alkali halide crystal doped with a divalent element in the amount of 0.5 to 5 weight percent, said doped crystal having an optical transmission of at least 45% at a wavelength of about 500 nm; b. disposing said scintillator in the path of a beam of radiation so that said scintillator scintillates upon absorbing said radiation; and c. detecting said scintillation.

29. A method of detecting radiation in accordance with claim 28 wherein said optical transmission is at least 50%.

30. A method of detecting radiation in accordance with claim 28 wherein said alkali halide crystal comprises at least one alkali halide selected from the group consisting of lithium fluoride, lithium chloride, lithium bromide, lithium iodide, sodium fluoride, sodium chloride, sodium bromide, sodium iodide, potassium fluoride, potassium chloride, potassium bromide, potassium iodide, rubidium fluoride, rubidium chloride, rubidium bromide, rubidium iodide, cesium fluoride, cesium chloride, cesium bromide, and cesium iodide.

31. A method of detecting radiation in accordance with claim 28 wherein said divalent element comprises at least one divalent element selected from the group consisting of europium and ytterbium.

32. A method of detecting radiation in accordance with claim 28 wherein said doped crystal comprises lithium iodide doped with europium.

33. A method of detecting radiation in accordance with claim 32 wherein lithium iodide comprises enriched lithium-6 isotope.

34. A method of detecting radiation in accordance with claim 28 wherein said radiation comprises at least one radiation selected from the group consisting of alpha radiation, beta radiation, gamma radiation, neutron radiation, and X-ray radiation.

* * * * *